United States Patent
Ogata

(10) Patent No.: US 11,558,570 B2
(45) Date of Patent: Jan. 17, 2023

(54) SOLID-STATE IMAGE CAPTURING DEVICE AND MANUFACTURING METHOD OF SOLID-STATE IMAGE CAPTURING DEVICE

(71) Applicant: SONY SEMICONDUCTOR SOLUTIONS CORPORATION, Kanagawa (JP)

(72) Inventor: Yosuke Ogata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,663

(22) PCT Filed: Aug. 20, 2019

(86) PCT No.: PCT/JP2019/032514
§ 371 (c)(1),
(2) Date: Feb. 17, 2021

(87) PCT Pub. No.: WO2020/045173
PCT Pub. Date: Mar. 5, 2020

(65) Prior Publication Data
US 2021/0297615 A1   Sep. 23, 2021

(30) Foreign Application Priority Data
Aug. 30, 2018  (JP) .............................. JP2018-161787

(51) Int. Cl.
*H04N 5/374* (2011.01)
*H01L 27/146* (2006.01)

(52) U.S. Cl.
CPC ....... *H04N 5/374* (2013.01); *H01L 27/14605* (2013.01); *H01L 27/14643* (2013.01); *H01L 27/14687* (2013.01); *H01L 27/14689* (2013.01)

(58) Field of Classification Search
CPC .............. H04N 5/374; H01L 27/14605; H01L 27/14643; H01L 27/14687; H01L 27/14689; H01L 27/14618
See application file for complete search history.

(56) References Cited

U.S. PATENT DOCUMENTS

| | | | |
|---|---|---|---|
| 2006/0023108 A1* | 2/2006 | Watanabe | H01L 27/14627 348/335 |
| 2009/0194668 A1* | 8/2009 | Kong | H01L 27/14685 250/201.2 |

(Continued)

FOREIGN PATENT DOCUMENTS

| CN | 104282698 A | 1/2015 |
|---|---|---|
| CN | 104347654 A | 2/2015 |

(Continued)

OTHER PUBLICATIONS

International Search Report and Written Opinion of PCT Application No. PCT/JP2019/032514, dated Nov. 12, 2019, 06 pages of ISRWO.

*Primary Examiner* — Lin Ye
*Assistant Examiner* — John H Morehead, III
(74) *Attorney, Agent, or Firm* — Chip Law Group

(57) ABSTRACT

A solid-state image capturing device according to the present disclosure includes an image capturing element, a light transmitting member, a support member, a sealing resin member, and a wall member. The image capturing element is mounted on a substrate. The support member is arranged in a part of an outer-peripheral portion of the image capturing element, the outer-peripheral portion surrounding a light receiving unit of the image capturing element. The light transmitting member is supported by the support member. The sealing resin member is arranged in a peripheral portion of the image capturing element. The wall member is provided between the sealing resin member and a part of the (Continued)

outer-peripheral portion of the image capturing element, the part excluding a part in which the support member is arranged.

9 Claims, 7 Drawing Sheets

(56) References Cited

U.S. PATENT DOCUMENTS

| | | | |
|---|---|---|---|
| 2012/0211852 A1* | 8/2012 | Iwafuchi | H01L 27/14685 |
| | | | 257/435 |
| 2015/0011038 A1 | 1/2015 | Huang et al. | |
| 2015/0054112 A1 | 2/2015 | Iwama et al. | |
| 2018/0012919 A1 | 1/2018 | Tu et al. | |
| 2019/0096948 A1* | 3/2019 | Masuda | H01L 27/14634 |

FOREIGN PATENT DOCUMENTS

| | | |
|---|---|---|
| CN | 107591420 A | 1/2018 |
| EP | 3267485 A | 1/2018 |
| JP | 2015-19031 A | 1/2015 |
| JP | 2015-32653 A | 2/2015 |
| JP | 2018-006759 A | 1/2018 |
| KR | 10-1467699 B1 | 12/2014 |
| KR | 10-2015-0016082 A | 2/2015 |

* cited by examiner

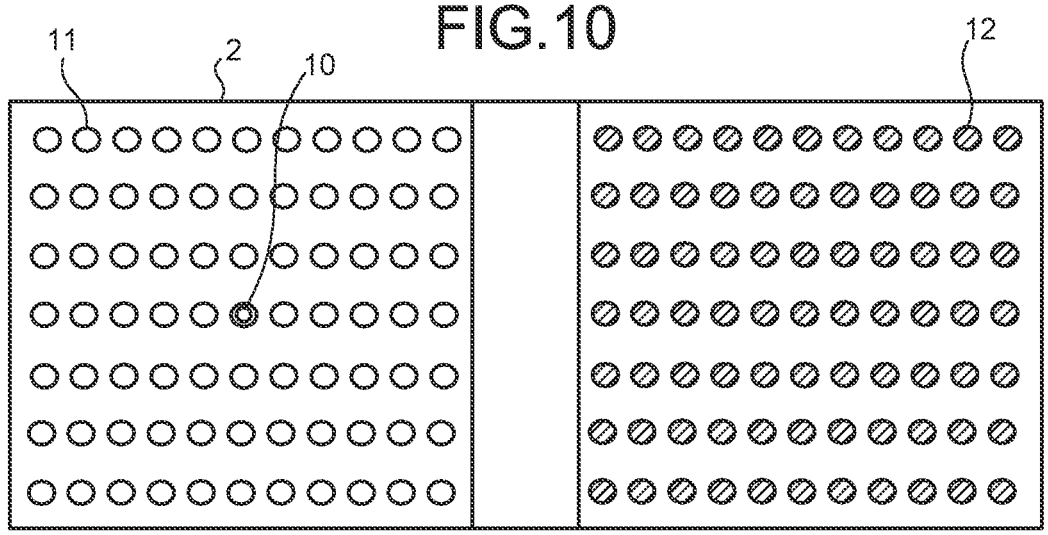
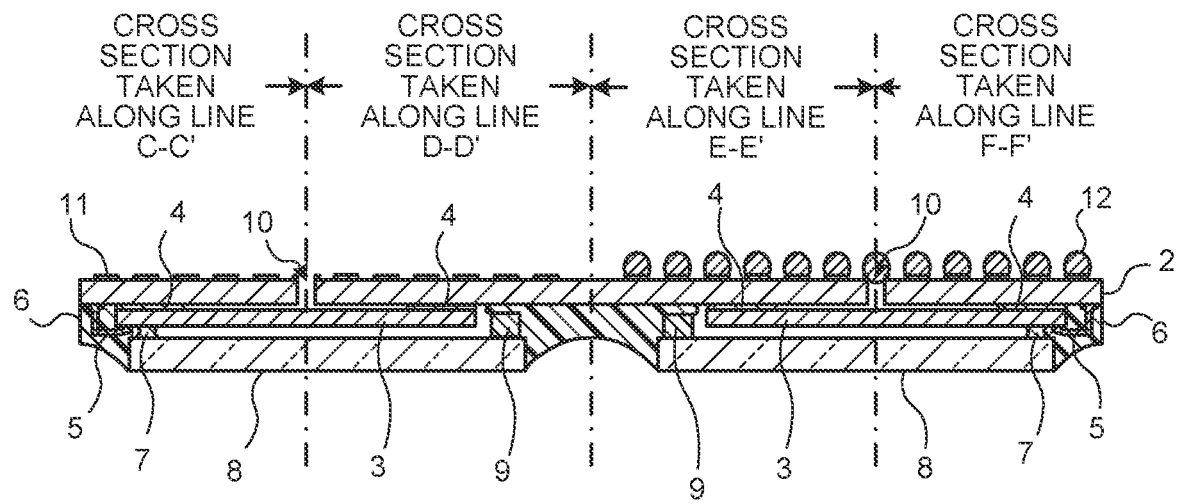
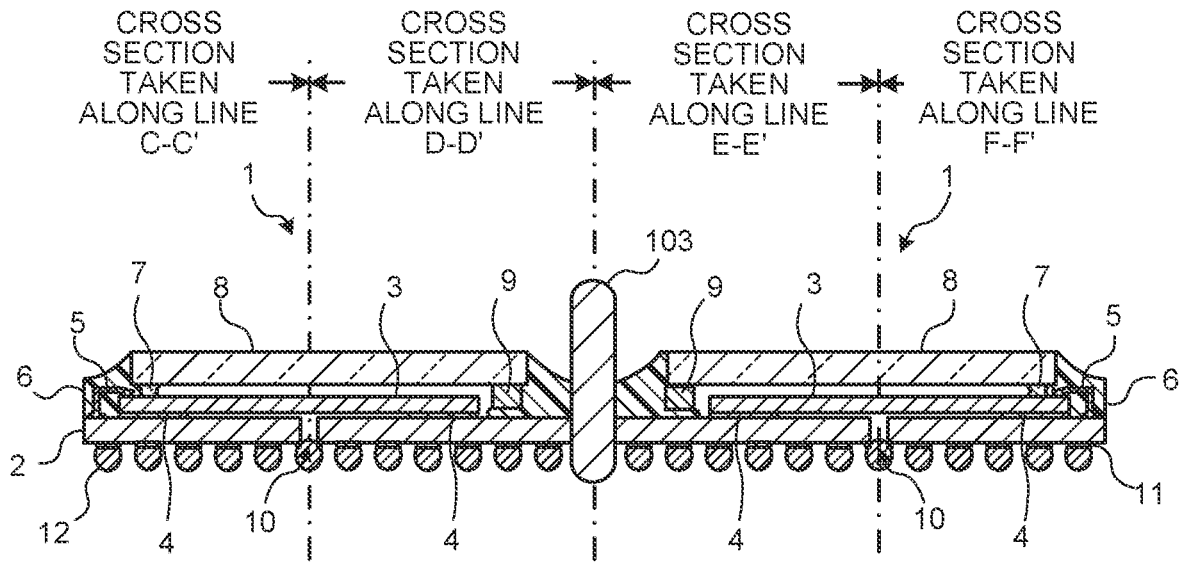

SOLID-STATE IMAGE CAPTURING DEVICE AND MANUFACTURING METHOD OF SOLID-STATE IMAGE CAPTURING DEVICE

CROSS REFERENCE TO RELATED APPLICATIONS

This application is a U.S. National Phase of International Patent Application No. PCT/JP2019/032514 filed on Aug. 20, 2019, which claims priority benefit of Japanese Patent Application No. JP 2018-161787 filed in the Japan Patent Office on Aug. 30, 2018. Each of the above-referenced applications is hereby incorporated herein by reference in its entirety.

FIELD

The present disclosure relates to a solid-state image capturing device and a manufacturing method of the solid-state image capturing device.

BACKGROUND

In a manufacturing process of a solid-state image capturing device, when bonding wires are sealed with resin which connect an image capturing element mounted on a substrate and the substrate with each other, adhesion of an extraneous matter such as sealing resin on a light receiving surface of the image capturing element is to be avoided.

Thus, there has been known a technology in which a support member is provided that surrounds an outer periphery of the light receiving surface of the image capturing element, a plate having transparency to light is placed on the support member so as to cover the light receiving surface, an space upper than the light receiving surface of the image capturing element is formed into a closed space, and then the bonding wires are sealed with resin (for example, see Patent Literature 1).

CITATION LIST

Patent Literature

Patent Literature 1: JP 2015-019031 A

SUMMARY

Technical Problem

However, in the above-mentioned conventional technology, there presents need for keeping, on an outer periphery of the light receiving surface in the image capturing element, a region on which the support member is to be provided, so that it is difficult to miniaturize a solid-state image capturing device.

Thus, in the present disclosure, there are proposed a solid-state image capturing device and a manufacturing method of the solid-state image capturing device capable of being miniaturized.

Solution to Problem

According to the present disclosure, a solid-state image capturing device is provided. The solid-state image capturing device according to the present disclosure includes an image capturing element, a light transmitting member, a support member, a sealing resin member, and a wall member. The image capturing element is mounted on a substrate. The support member is arranged in a part of an outer-peripheral portion of the image capturing element, the outer-peripheral portion surrounding a light receiving unit of the image capturing element. The light transmitting member is supported by the support member. The sealing resin member is arranged in a peripheral portion of the image capturing element. The wall member is provided between the sealing resin member and a part of the outer-peripheral portion of the image capturing element, the part excluding a part in which the support member is arranged.

According to the present disclosure, a manufacturing method of a solid-state image capturing device is provided. The manufacturing method of the solid-state image capturing device includes mounting an image capturing element on a substrate; forming a support member in a part of an outer-peripheral portion of the image capturing element, the outer-peripheral portion surrounding a light receiving unit of the image capturing element; causing the support member to support a light transmitting member provided with a wall member that is arranged in a part of an outer-peripheral portion of a principal surface, facing the image capturing element, of the light transmitting member, the part excluding a part supported by the support member; and sealing a peripheral portion of the image capturing element by using a sealing resin member.

BRIEF DESCRIPTION OF DRAWINGS

FIG. 10 is a diagram illustrating the manufacturing process of the solid-state image capturing device according to the present disclosure.

FIG. 11 is a diagram illustrating the manufacturing process of the solid-state image capturing device according to the present disclosure.

FIG. 12 is a diagram illustrating the manufacturing process of the solid-state image capturing device according to the present disclosure.

DESCRIPTION OF EMBODIMENTS

The following describes preferable embodiments of the present disclosure in detail with reference to the attached drawings. In the present specification and the drawings, overlap of descriptions will be avoided by providing the same reference symbols for constituent elements having substantially the same functional configuration.

[Structure of Solid-State Image Capturing Device]

Figure 1A:
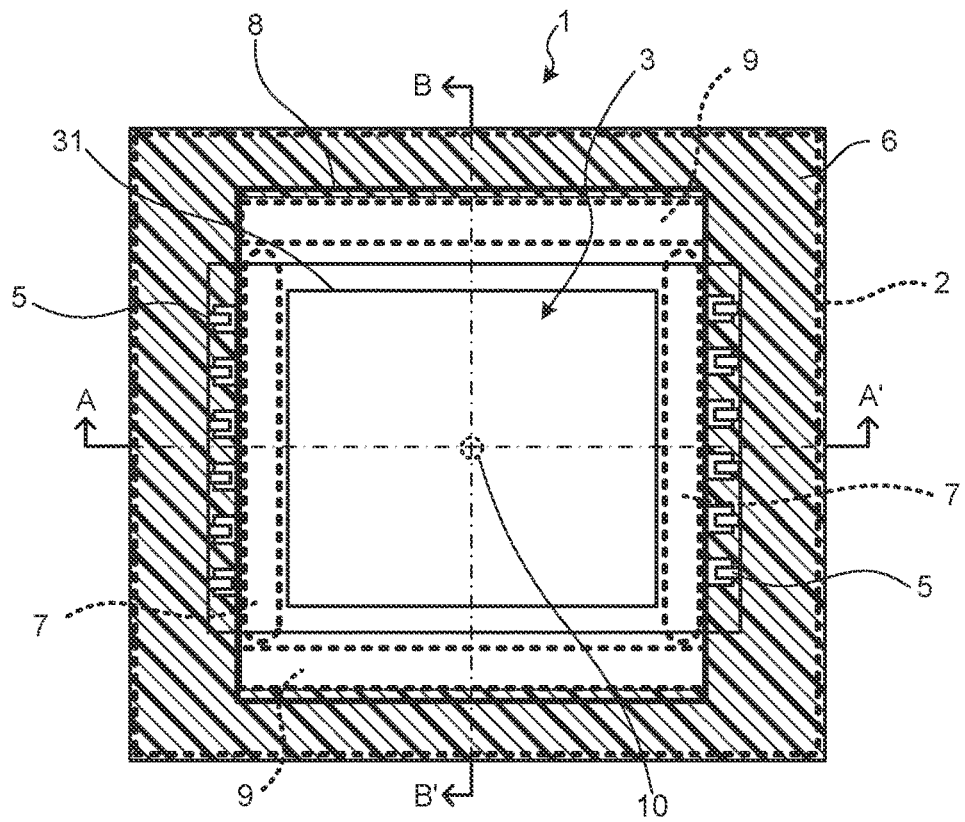
FIG. 1A is a plan view illustrating a solid-state image capturing device according to the present disclosure.
Figure 1B:
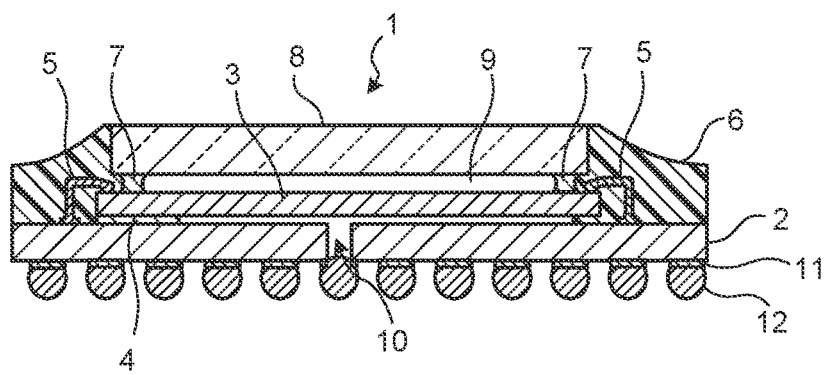
FIG. 1B is a cross-sectional view taken along a line A-A' illustrated in FIG. 1A according to the present disclosure.
Figure 1C:
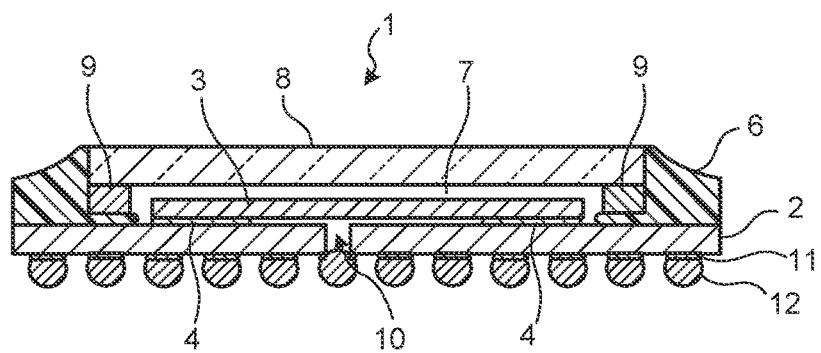
FIG. 1C is a cross-sectional view taken along a line B-B' illustrated in FIG. 1A according to the present disclosure.

First, with reference to FIGS. 1A, 1B, and 1C, structure of a solid-state image capturing device 1 according to the present disclosure will be explained. FIG. 1A is a plan view illustrating the solid-state image capturing device 1 according to the present disclosure. FIG. 1B is a cross-sectional view taken along a line A-A' illustrated in FIG. 1A according to the present disclosure. FIG. 1C is a cross-sectional view taken along a line B-B' illustrated in FIG. 1A according to the present disclosure.

As illustrated in FIGS. 1A, 1B, and 1C, the solid-state image capturing device 1 includes an image capturing element 3 mounted on a substrate 2. The substrate 2 is an organic substrate or a ceramic substrate, for example. The image capturing element 3 is a Complementary Metal Oxide Semiconductor (CMOS) image sensor, for example.

As illustrated in FIGS. 1B and 1C, the image capturing element 3 is fixed to the substrate 2 by bonding resin 4 that is applied to a part of the substrate 2, for example. The image capturing element 3 is formed in rectangular-shaped in a plan view, and a plurality of connection terminals that is arranged on opposed two of four sides surrounding a light receiving unit (see FIG. 1A) of the image capturing element 3 is connected with connection terminals arranged on the substrate 2 by using bonding wires 5. Positions illustrated in FIG. 1A where connection terminals of the image capturing element 3 are arranged are merely one example, and not limited to the positions illustrated in FIG. 1A.

The bonding wires 5 connecting the image capturing element 3 with the substrate 2 are sealed with a sealing resin member 6. The sealing resin member 6 is formed, in a plan view, in a peripheral portion of the image capturing element 3 so as to surround an outer periphery of the image capturing element 3.

In forming the sealing resin member, for example, when a part of the sealing resin member protrudes on the light receiving unit of the image capturing element, or when a part of the sealing resin member scatters on the light receiving unit of the image capturing element 3, it causes deterioration in a capturing performance.

Thus, there presents a technology that prevents an extraneous matter, such as a part of a sealing resin member, from adhering to a light receiving unit of an image capturing element when bonding wires are sealed with the sealing resin member. For example, there presents a technology in which a support member that surrounds an outer periphery of a light receiving unit on a side of a light receiving surface of the image capturing element is provided, a plate having transparency to light is placed on the support member so as to cover the support member, a space upper than the light receiving surface of the image capturing element is formed into a closed space, and then the bonding wires are sealed with resin.

However, in the above-mentioned technology, a region for providing the support member is to be provided on the entire periphery that surrounds the light receiving unit of the image capturing element, and thus it is difficult to miniaturize the solid-state image capturing device. Thus, the solid-state image capturing device 1 according to the present disclosure includes support members 7 that support a light transmitting member 8 in a part of the outer-peripheral portion of the solid-state image capturing device 1, which is surrounding the light receiving unit 31.

Specifically, as illustrated in FIGS. 1A and 1B, the solid-state image capturing device 1 includes the support members 7 that are arranged along opposed two sides on which the bonding wires 5 are provided of an outer periphery of the solid-state image capturing device 1, which is surrounding the light receiving unit 31.

The light transmitting member 8 that is formed in rectangular-shaped in a plan view is arranged at a position while interposing a predetermined interval from a light receiving surface of the image capturing element 3 in a state where opposed two of four sides of the light transmitting member 8 are supported by the support members 7.

Thus, the solid-state image capturing device 1 has no need to include a region in which the support members 7 are provided for supporting the light transmitting member 8 on opposed two sides, on which the bonding wires 5 are not provided, of an outer periphery of the solid-state image capturing device 1 surrounding the light receiving unit 31, and thus the solid-state image capturing device 1 is able to be miniaturized by amount of the above-mentioned region.

Note that when the sealing resin member 6 is formed, the solid-state image capturing device 1 has need to prevent the sealing resin member 6 from flowing toward the light receiving unit 31 from a part, in which the support members 7 are not provided, of an outer periphery of the solid-state image capturing device 1 surrounding the light receiving unit 31.

Thus, as illustrated in FIGS. 1A and 1C, the solid-state image capturing device 1 includes wall members 9 that are arranged between the sealing resin member 6 and a part excluding a part in which the support members 7 are provided in an outer-peripheral portion of the image capturing element 3.

In a process for sealing the bonding wires 5 with the sealing resin member 6, the above-mentioned wall members 9 function as a dam that stops the sealing resin member 6 entering toward the light receiving unit 31 of the image capturing element 3.

Thus, when the sealing resin member 6 is formed, the solid-state image capturing device 1 is capable of preventing the sealing resin member 6 from flowing toward the light receiving unit 31 from a part, in which the support members 7 are not provided, of an outer periphery of the solid-state image capturing device 1 which is surrounding the light receiving unit 31.

In the example illustrated in FIG. 1C, a case is exemplified in which the wall members 9 are provided to the light transmitting member 8; however, the wall members 9 may be provided to the substrate 2. When the wall members 9 are provided to the substrate 2, for example, the wall members 9 may be integrally molded with the substrate 2, thereby leading to improvement in productivity.

On the other hand, when being provided to the light transmitting member 8, the wall members 9 are formed such that thicknesses thereof are smaller than a thickness of the support members 7, and a thickness of a gap formed between the wall members 9 and the substrate 2 is less than a thickness of the substrate 2 in a state where the light transmitting member 8 is supported by the support members 7.

Thus, in the solid-state image capturing device 1, when the sealing resin member 6 is formed, a part of the sealing resin member 6 extends into the gap between the wall members 9 and the substrate 2 to fill the gap, and thus airtightness is improved in a space surrounded by the image capturing element 3, the light transmitting member 8, and the sealing resin member 6.

The solid-state image capturing device 1 is provided with a hole part 10 that penetrates through front and back surfaces of the substrate 2. The hole part 10 is arranged at a position of the substrate 2 in which a terminal 11 is formed, for example, and after the sealing resin member 6 is solidified by a hardening heat treatment, the hole part 10 is blocked by a solder ball 12.

The above-mentioned hole part 10 exhausts therefrom inner air having expanded by the hardening heat treatment of the sealing resin member 6 to the outside, so that it is possible to prevent breakage of the solid-state image capturing device 1, which is caused by thermal expansion of the inner air. The hole part 10 of the solid-state image capturing device 1 is finally blocked by the solder ball 12, so that airtightness of an internal space of the solid-state image capturing device 1 is maintained.

[Manufacturing Method of Solid-State Image Capturing Device]

Next, with reference to FIGS. 2 to 12, a manufacturing method of the solid-state image capturing device 1 will be explained. FIGS. 2 to 12 are diagrams illustrating a manufacturing process of the solid-state image capturing device 1 according to the present disclosure. Note that in FIGS. 2 to 12, there is illustrated a manufacturing process of the two solid-state image capturing devices 1.

In FIGS. 2, 5, 7, 9, and 10, the manufacturing process is illustrated in a plan view, and in FIGS. 3, 4, 6, 8, 11, and 12, the manufacturing process is illustrated in a cross-sectional view. In each of the drawings illustrating the manufacturing process in a cross-sectional view, there are illustrated cross sections taken along a line C-C', a line D-D', a line E-E', and a line F-F' illustrated in FIG. 2 in this order.

Figure 2:
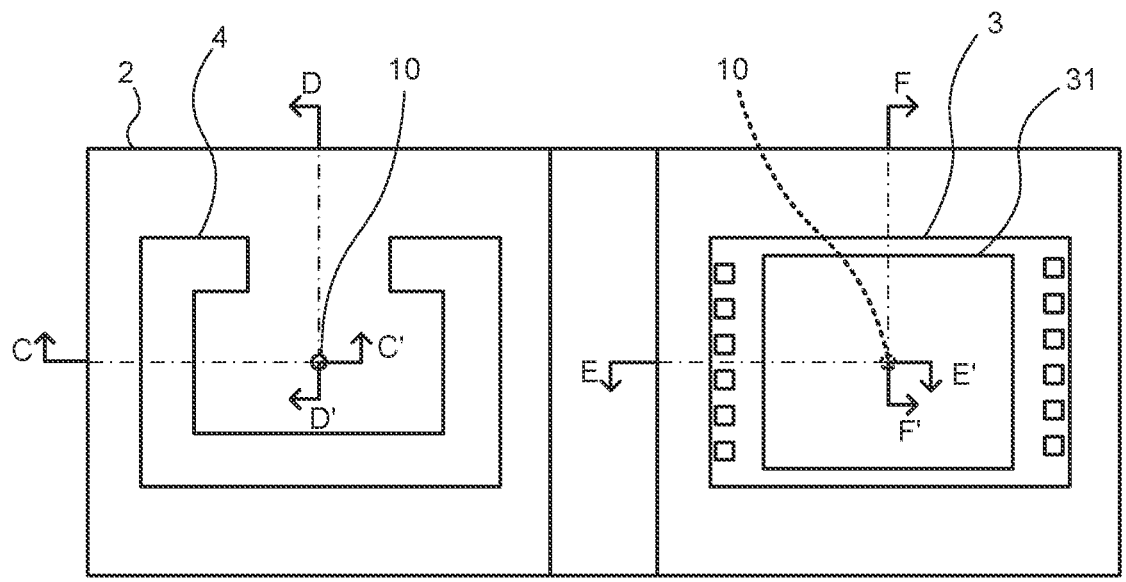
FIG. 2 is a diagram illustrating a manufacturing process of the solid-state image capturing device according to the present disclosure.

As illustrated in FIG. 2, when manufacturing the solid-state image capturing device 1, first, the substrate 2 such as an organic substrate or a ceramic substrate is prepared on which a predetermined electronic circuit is patterned. The substrate 2 is provided with the hole part 10 that penetrates through front and back surfaces of the substrate 2.

Next, as illustrated in a left half portion of the substrate 2 illustrated in FIG. 2, the bonding resin 4 is applied to a mount region of the image capturing element 3 on one principal surface (hereinafter, may be referred to as upper surface) of the substrate 2. In this case, the bonding resin 4 is not applied to whole of the mount region of the image capturing element 3, but is applied to be C-shaped in a plan view within a range that does not stick out of the mount region of the image capturing element 3.

Thus, it is possible to prevent a situation where the bonding resin 4 sticks out of an outer periphery of the image capturing element 3 after the image capturing element 3 is mounted, and a part of the stuck bonding resin 4 adheres to the light receiving unit 31 of the image capturing element 3. Moreover, the bonding resin 4 is applied to an upper surface of the substrate 2 so as to be C-shaped in a plan view, in other words, so as to be a circular shape in a part of which a cut-out part is formed, so that it is possible to exhaust, through the hole part 10, air in the device that is to expand in the latter thermal treatment from the cut-out part of the bonding resin 4 to the outside of the device.

Subsequently, as illustrated in a right half portion of the substrate 2 illustrated in FIG. 2, the image capturing element 3 is placed on an upper surface of the substrate 2 to which the bonding resin 4 has been applied. Thus, as illustrated in FIG. 3, the image capturing element 3 is bonded and fixed to a predetermined position in the upper surface of the substrate 2 by the bonding resin 4.

Incidentally, the image capturing element 3 is a laminated-type CMOS image sensor including the light receiving unit 31 that photoelectrically converts light having been made incident on an upper layer of the image capturing element 3, and further including, in a lower layer of the image capturing element 3, a signal processing circuit that processes a photoelectrically-converted signal. An occupation area of the laminated-type CMOS image sensor is reduced to be able to miniaturize the laminated-type CMOS image sensor compared with an image sensor in which the light receiving unit 31 and the signal processing circuit are arranged on the same plane.

Figure 3:
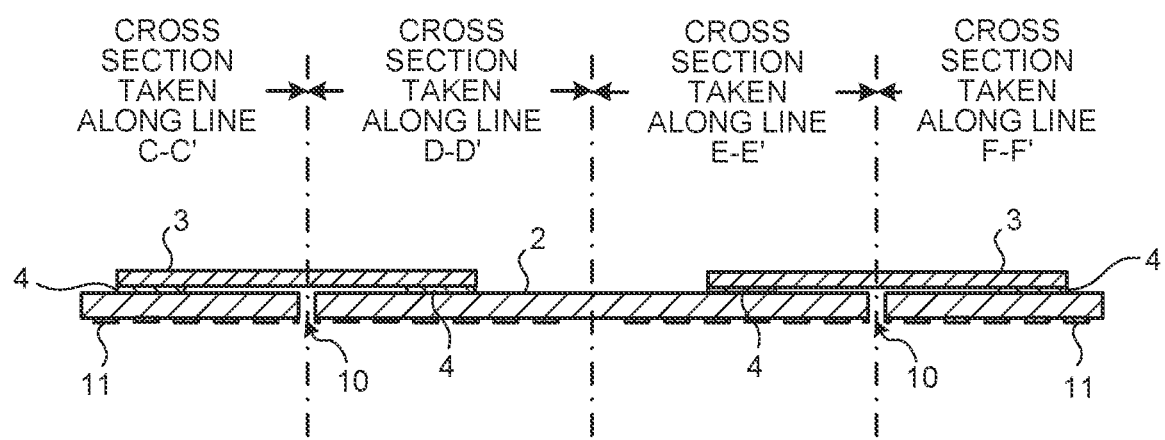
FIG. 3 is a diagram illustrating the manufacturing process of the solid-state image capturing device according to the present disclosure.

Additionally, as illustrated in FIG. 3, the plurality of terminals 11 is arranged on the other (hereinafter, may be referred to as lower surface) of principal surfaces of the substrate 2. The hole part 10 is arranged at a position in which one of the plurality of terminals 11 is formed. Herein, the one hole part 10 is provided to the one image capturing element 3; however, the two or more hole parts 10 may be provided thereto.

Figure 4:
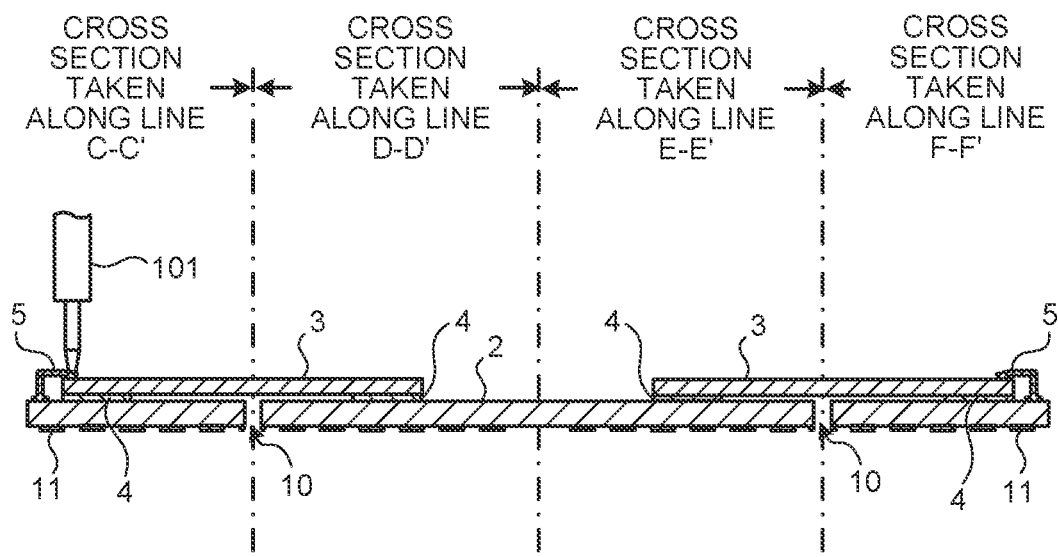
FIG. 4 is a diagram illustrating the manufacturing process of the solid-state image capturing device according to the present disclosure.
Figure 5:
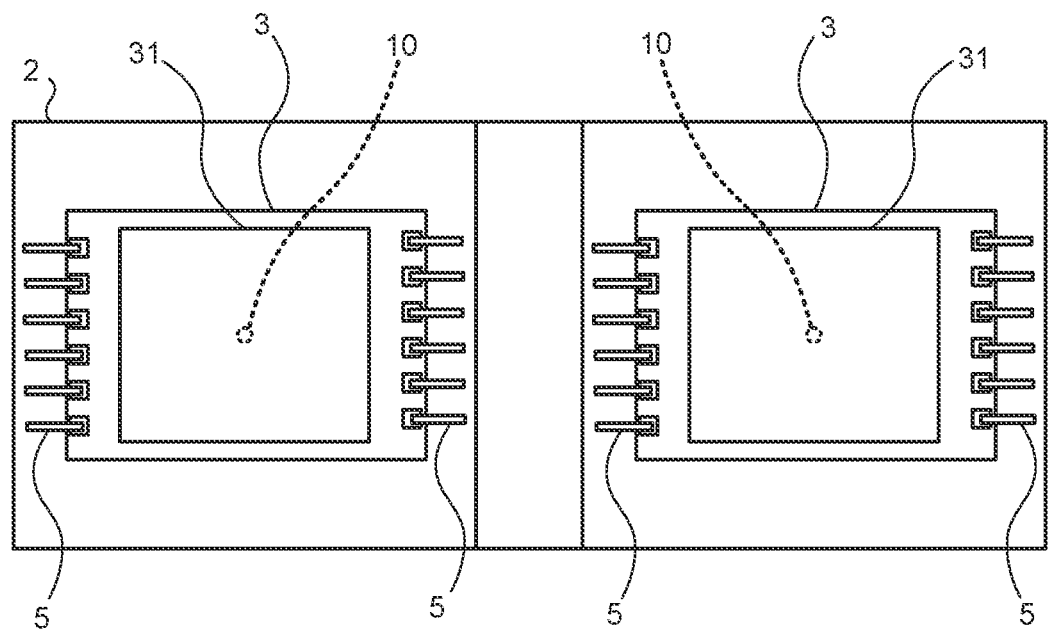
FIG. 5 is a diagram illustrating the manufacturing process of the solid-state image capturing device according to the present disclosure.

Next, as illustrated in FIG. 4, a bonding device 101 connects the image capturing element 3 and the substrate 2 with each other by using the bonding wires 5 such as gold wires. Thus, as illustrated in FIG. 5, a plurality of connection terminals arranged along opposed two sides of each of the image capturing elements 3 and a plurality of connection terminals arranged at predetermined positions on a substrate are electrically connected to each other.

Figure 6:
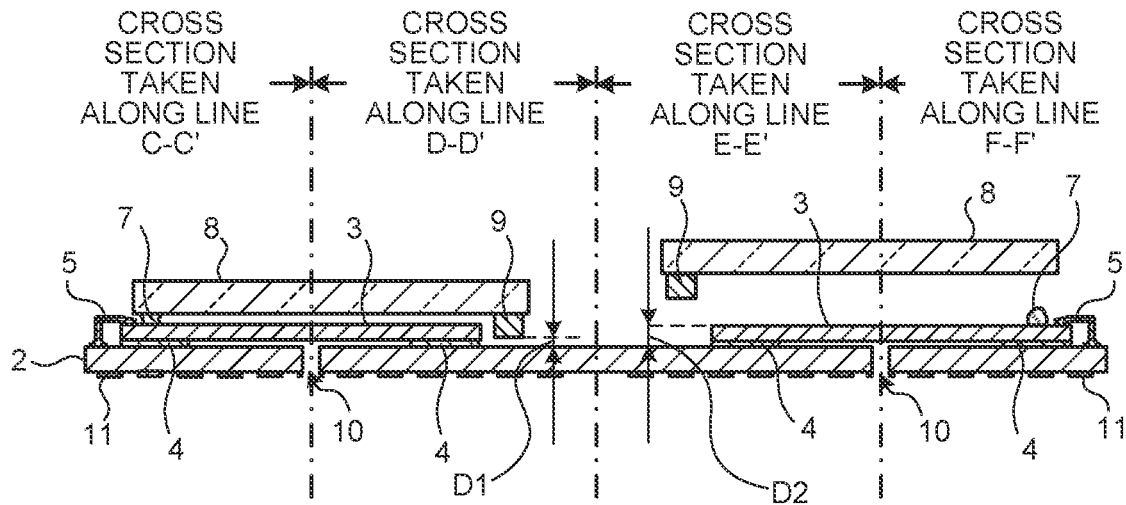
FIG. 6 is a diagram illustrating the manufacturing process of the solid-state image capturing device according to the present disclosure.
Figure 7:
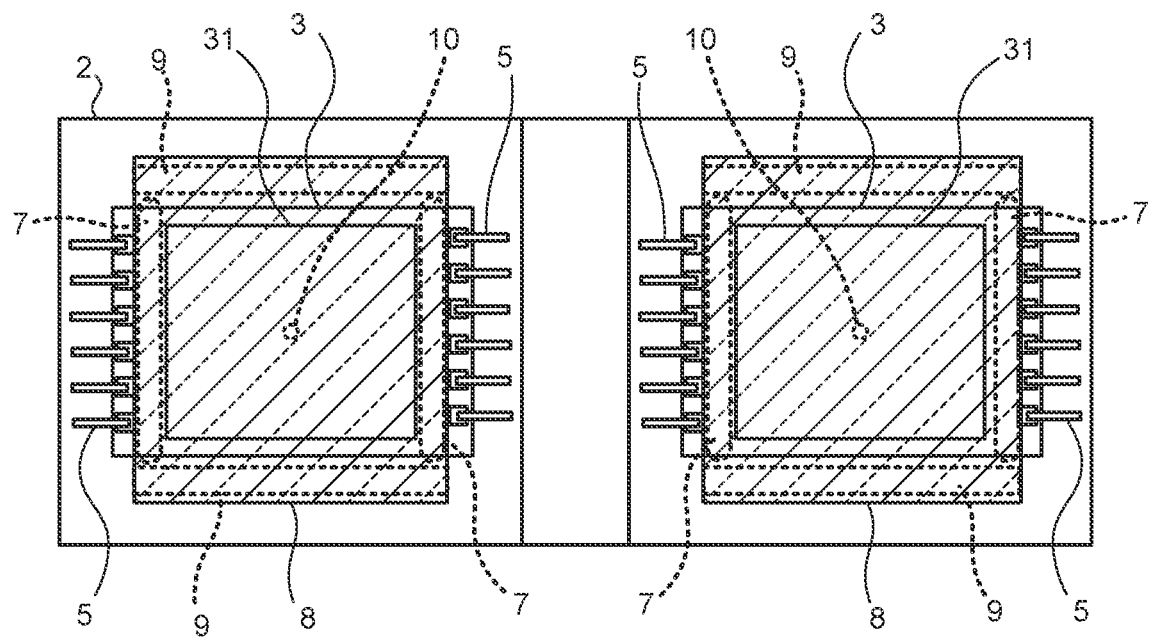
FIG. 7 is a diagram illustrating the manufacturing process of the solid-state image capturing device according to the present disclosure.

Subsequently, as illustrated in FIGS. 6 and 7, the support members 7 each of which is linear-shaped in a plan view are formed with the use of resin in a region between a region with which the bonding wires 5 of the image capturing element 3 are connected and the light receiving unit 31 of the image capturing element 3. As material of the support members 7, a thermosetting resin is employed whose bonding strength is higher than that of an ultraviolet curing resin.

In this case, the support members 7 are not formed in a part, with which the bonding wires 5 are not connected, of an outer-peripheral portion in an upper surface of the image capturing element 3. Thus, there presents no need to provide a region for arranging the support members 7 in a part, with which the bonding wires 5 are not connected, of an outer-peripheral portion in the upper surface, and thus the image capturing element 3 is able to be miniaturized by amount thereof.

Subsequently, the image capturing element 3 is covered with the light transmitting member 8 that is formed in rectangular-shaped in a plan view, and thus the support members 7 support a part of the light transmitting member 8. The light transmitting member 8 is a plate having transparency to light such as a glass plate and an acrylic plate.

There are arranged, in a predetermined position in a principal surface (herein, lower surface) facing the image capturing element 3 of the light transmitting member 8, the wall members 9 that prevent the sealing resin member 6, which is to be formed in an outer periphery of the image capturing element 3 in the latter process, from intruding into the light receiving unit 31 of the image capturing element 3. When the light transmitting member 8 is arranged above the image capturing element 3, the wall members 9 are provided in positions arranged along a part excluding a part, in which the support members 7 are arranged, of an outer-peripheral portion surrounding the light receiving unit 31 of the image capturing element 3.

For example, when photosensitive material is applied to a lower surface of the light transmitting member 8 and a region other than a part to be left as the wall members 9 is masked and exposed, the above-mentioned wall members 9 is able to be formed. Moreover, bonding resin may be applied to a predetermined position in a lower surface of the light transmitting member 8 so as to form the wall member 9.

When the wall member 9 is formed by using a photosensitive material, a shape and a formed position of the wall member 9 is able to be controlled with high accuracy. Furthermore, when the wall member 9 is formed by using a bonding resin, there presents no need for formation of a mask or patterning, and thus it is possible to simplify the work and further reduce the cost.

When the light transmitting member 8 is supported by the support members 7, lengths of the wall members 9 in a thickness direction of the substrate 2 are set to be shorter than a length from an upper surface of the substrate 2 to a lower surface of the light transmitting member 8 so as to generate a gap between the wall members 9 and the substrate 2. Thus, it is possible to prevent breakage of the support members 7 during a thermal treatment for thermally curing the support members 7.

Specifically, in a case where a thermal treatment is executed for solidifying the support members 7 that are formed of a thermosetting resin, when a space between the image capturing element 3 and the light transmitting member 8 is completely sealed, there presents possibility that air in the closed space thermally expands to burst the support members 7.

Thus, in the present disclosure, when the light transmitting member 8 is supported by the support members 7, a gap is purposely formed between lower ends of the wall members 9 and an upper surface of the substrate 2. Thus, a space between the image capturing element 3 and the light transmitting member 8 and the outside of is communicated with each other by a gap formed between the lower ends of the wall members 9 and the upper surface of the substrate 2.

Therefore, when a thermal treatment is executed in order to solidify the support members 7, air that has thermally expanded in a space between the image capturing element 3 and the light transmitting member 8 is led to the outside from the gap formed between the lower ends of the wall members 9 and the upper surface of the substrate 2, so that it is possible to prevent breakage of the support members 7.

When the light transmitting member 8 is supported by the support members 7, an interval D1 of a gap formed between the wall member 9 and the substrate 2 is formed to be less than a thickness of the image capturing element 3, more preferably, less than a length D2 that is from an upper surface of the substrate 2 to an upper surface of the image capturing element 3 mounted on the substrate 2. Effects of the design of the interval D1 of the gap will be mentioned later with reference to FIG. 8.

When the light transmitting member 8 is supported by the support members 7, a slight gap is formed between the wall member 9 and the support members 7 adjacent thereto. Effects of the above-mentioned gap will be also mentioned later with reference to FIG. 8.

Subsequently, a thermal treatment is executed to solidify the support members 7 without breakage, and the support members 7 and the light transmitting member 8 are stiffly bonded. In this case, the support members 7 formed of a thermosetting resin are once softened and then solidified after start of the thermal treatment.

Thus, in the thermal treatment, in order to prevent a tilt of the light transmitting member 8 due to softening of the thermosetting resin, it is desirable that the thermosetting resin is temporary cured under a state where a height position and a horizontal state of the light transmitting member 8 are held.

Figure 8:
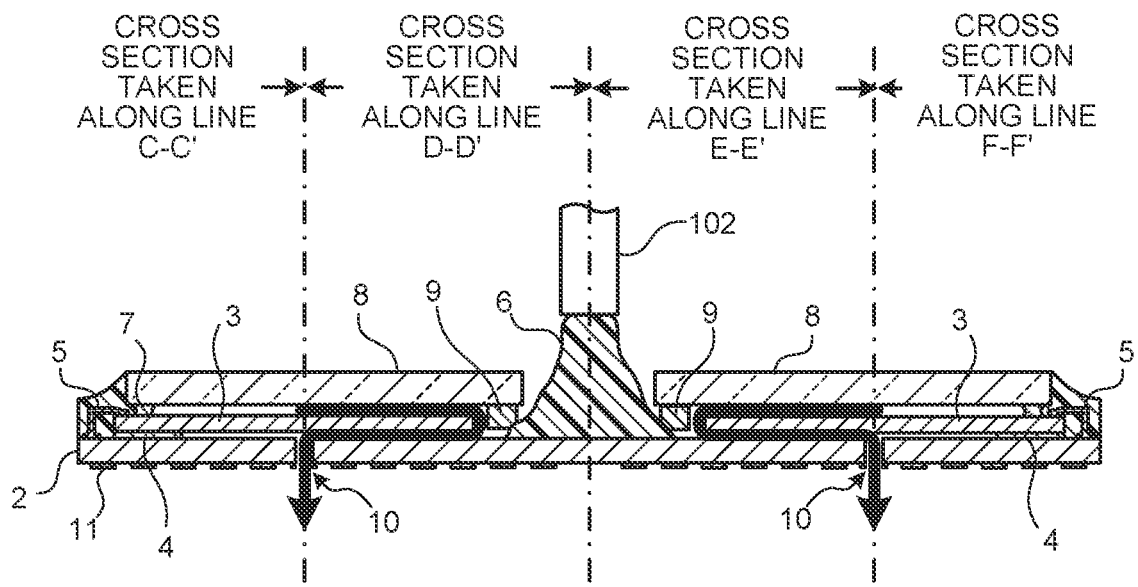
FIG. 8 is a diagram illustrating the manufacturing process of the solid-state image capturing device according to the present disclosure.
Figure 9:
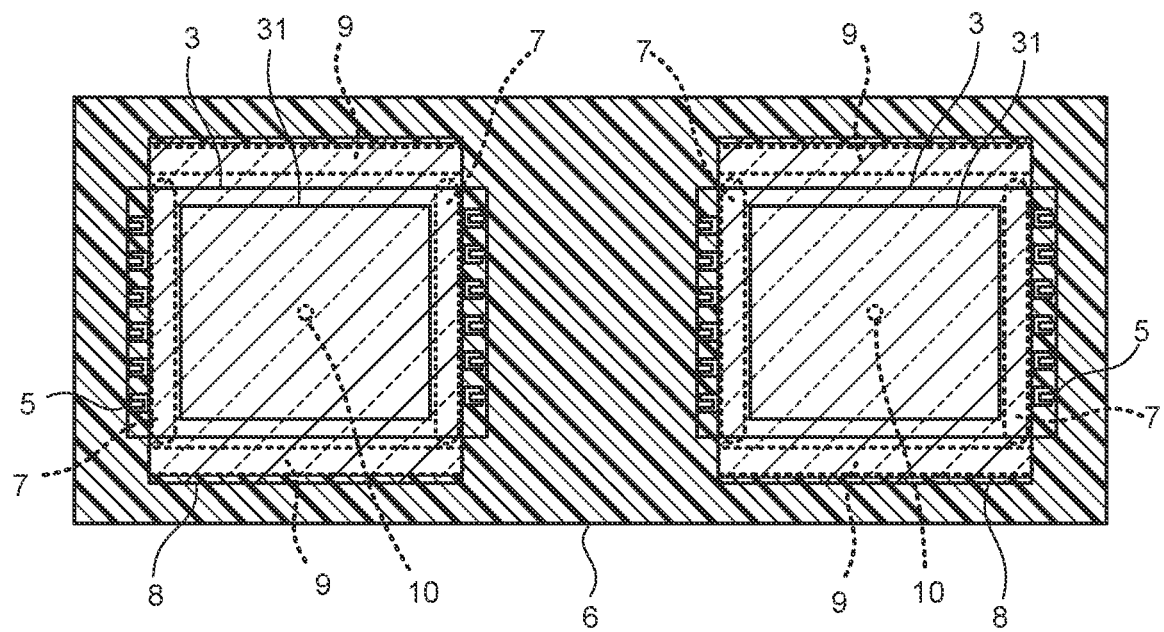
FIG. 9 is a diagram illustrating the manufacturing process of the solid-state image capturing device according to the present disclosure.

Subsequently, as illustrated in FIG. 8, the sealing resin member 6 is ejected from a resin sealing device 102 while causing the resin sealing device 102 to move along an outer periphery of the light transmitting member 8. Thus, as illustrated in FIG. 9, the bonding wires 5 are sealed with the sealing resin member 6 that surrounds the entire perimeter of the outer periphery of the light transmitting member 8. As a material of the sealing resin member 6, a thermosetting resin is used whose bonding strength is higher than those of ultraviolet curing resins.

Herein, as described above, a gap is formed between the wall member 9 and the substrate 2, and the gap is filled with the sealing resin member 6. In this case, the interval D1 of the gap formed between the wall member 9 and the substrate 2 is formed to be less than the length D2 from the upper surface of the substrate 2 to the upper surface of the image capturing element 3 mounted on the substrate 2. Additionally, thermosetting resin before curing has viscosity to some extent.

Thus, even when a thermosetting resin flows into the gap between the wall members 9 and the substrate 2 by pressure of ejection from the resin sealing device 102, the thermosetting resin does not rise up to a height position at which the light receiving unit 31 of the image capturing element 3 is arranged. Thus, it is possible to prevent the thermosetting resin from adhering to the light receiving unit 31 of the image capturing element 3.

Next, when a thermal treatment for solidifying the sealing resin member 6 is executed, air in a space surrounded by the image capturing element 3, the light transmitting member 8, and the sealing resin member 6 thermally expands. In this case, as described above, a slight gap is formed between the wall members 9 and the support members 7 adjacent thereto.

The bonding resin 4 bonding the substrate 2 and the image capturing element 3 to each other is formed in C-shaped in a plan view, and a cut-out part is formed in a part of a circular part thereof. Moreover, the substrate 2 is provided with the hole part 10 that penetrates through front and back surfaces of the substrate 2.

Thus, as indicated by using bold arrows illustrated in FIG. 8, it is possible to exhaust thermally-expanded air from the space on the image capturing element 3 to the outside via the gap between the wall members 9 and the support members 7, the cut-out part of the bonding resin 4, and the hole part 10 of the substrate 2.

Therefore, when a thermal treatment for solidifying the sealing resin member 6 is executed, it is possible to prevent the sealing resin member 6 from bursting due to the thermally-expanded inner air. Thus, when a thermal treatment is executed thereafter, the sealing resin member 6 is able to be solidified without breakage, and further to stiffly seal the bonding wires 5 by using the sealing resin member 6.

Subsequently, as illustrated in FIGS. 10 and 11, front and back of the substrate 2 are inverted. The solder balls 12 are bonded to the plurality of terminals 11 that is provided to the substrate 2. Thus, the hole part 10 provided to the substrate 2 is blocked by the solder ball 12, so that an internal space in which the image capturing element 3 is arranged is able to be a closed space.

Herein, the hole part 10 provided to the substrate 2 is blocked by the solder ball 12; however, may be blocked by solder paste.

Next, as illustrated in FIG. 12, front and back of the substrate 2 are again inverted, the sealing resin member 6 is cut along the center line of the sealing resin member 6 between the light transmitting members 8 by using a blade 103 of a cutting device so as to obtain individually separated pieces, and the solid-state image capturing devices 1 are completed.

[Modification]

Figure 13:
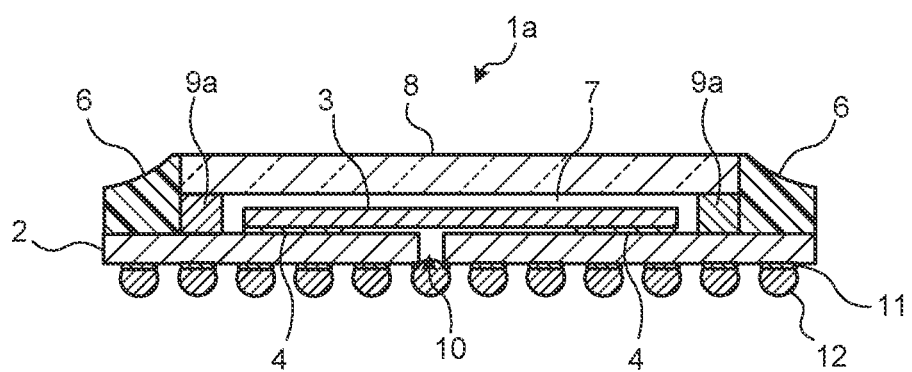
FIG. 13 is a cross-sectional view illustrating a solid-state image capturing device according to a modification of the present disclosure.

The above-mentioned embodiment is merely one example, and there present various modifications. FIG. 13 is a cross-sectional view illustrating a solid-state image capturing device 1a according to a modification of the present disclosure. In FIG. 13, a cross section of the solid-state image capturing device 1a is illustrated, which is corresponding to FIG. 1C.

As illustrated in FIG. 13, in the solid-state image capturing device 1a according to the modification, shapes of wall members 9a alone are different from those of the solid-state image capturing device 1 illustrated in FIG. 1C. Lower end parts of the wall members 9a are in contact with an upper surface of the substrate 2. According to the wall members 9a, correction of a height position and a tilt state of the light transmitting member 8 become easy.

Therefore, for example, at a start of the thermal treatment for solidifying the support members 7 that are formed of thermosetting resin, the solid-state image capturing device 1a is capable of preventing a tilt of the light transmitting member 8 that is caused by softening of the thermosetting resin.

In the above-mentioned embodiment, the case has been explained where the support members 7 are arranged at two positions along opposed two sides on which the bonding wires 5 are provided of an outer periphery of the image capturing element 3, which is surrounding the light receiving unit 31; however, this is merely one example.

As long as being able to support the light transmitting member 8 at one or more positions, the support member 7 may be arranged at one or more positions of an outer periphery of the image capturing element 3, which is surrounding the light receiving unit 31. In other words, the number of the support members 7 may be arbitrary as long as the support member 7 is not arranged on the entire perimeter of the outer periphery surrounding the light receiving unit 31.

In a case of the above-mentioned configuration, each of the wall members 9 and 9a is arranged between a part in which the support member 7 is not arranged on an outer-peripheral portion of the image capturing element 3 and the sealing resin member 6. By employing the above-mentioned configuration, a region for arranging the support member 7 is omitted, so that it is possible to miniaturize the solid-state image capturing devices 1 and 1a.

The effects described in the present specification are merely explanations or exemplifications, and are not limiting. In other words, the techniques according to the present disclosure may exert other effects.

Configurations below also belong to the technical scope of the present disclosure.

(1)

A solid-state image capturing device including:

an image capturing element that is mounted on a substrate;

a support member that is arranged in a part of an outer-peripheral portion of the image capturing element, the outer-peripheral portion surrounding a light receiving unit of the image capturing element;

a light transmitting member that is supported by the support member;

a sealing resin member arranged in a peripheral portion of the image capturing element; and a wall member that is provided between the sealing resin member and a part of the outer-peripheral portion of the image capturing element, the part excluding a part in which the support member is arranged.

(2)

The solid-state image capturing device according to (1), wherein the wall member is provided to the light transmitting member.

(3)

The solid-state image capturing device according to (2), wherein a part of the sealing resin member is extended into a gap between the wall member and the substrate.

(4)

The solid-state image capturing device according to (3), wherein an interval of the gap is less than a thickness of the image capturing element.

(5)

The solid-state image capturing device according to any one of (1) to (4), wherein the sealing resin member is formed of a thermosetting resin, and the substrate is provided with a hole part that penetrates through front and back surfaces of the substrate.

(6)

The solid-state image capturing device according to (5), wherein the hole part is arranged at a position in the substrate where a terminal is formed, and is blocked by a solder.

(7)

The solid-state image capturing device according to any one of (1) to (6), further comprising:

a bonding resin that is arranged between the substrate and the image capturing element, and is formed in C-shaped in a plan view.

(8)

The solid-state image capturing device according to any one of (1) to (7), wherein the wall member includes a photosensitive material.

(9)

The solid-state image capturing device according to any one of (1) to (7), wherein the wall member includes a bonding resin.

(10)

A manufacturing method of a solid-state image capturing device, the method including:

mounting an image capturing element on a substrate;

forming a support member in a part of an outer-peripheral portion of the image capturing element, the outer-peripheral portion surrounding a light receiving unit of the image capturing element;

causing the support member to support a light transmitting member provided with a wall member that is arranged in a part of an outer-peripheral portion of a principal surface, facing the image capturing element, of the light transmitting member, the part excluding a part supported by the support member; and sealing a peripheral portion of the image capturing element by using a sealing resin member.

REFERENCE SIGNS LIST 1, 1a Solid-state image capturing device
2 Substrate
3 Image capturing element
4 Bonding resin
5 Bonding wire
6 Sealing resin member
7 Support member
8 Light transmitting member
9, 9a Wall member
10 Hole part

The invention claimed is:

1. A solid-state image capturing device, comprising:
an image capturing element on a substrate, wherein
the substrate includes a hole part, and
the hole part penetrates through a front surface and a back surface of the substrate;
a support member in a first part of an outer-peripheral portion of the image capturing element, wherein the outer-peripheral portion surrounds a light receiving unit of the image capturing element;
a light transmitting member supported by the support member;
a sealing resin member in a peripheral portion of the image capturing element, wherein the sealing resin member comprises a thermosetting resin; and
a wall member between the sealing resin member and a second part of the outer-peripheral portion of the image capturing element, wherein the second part is different from the first part of the outer-peripheral portion.

2. The solid-state image capturing device according to claim 1, wherein the wall member is provided to the light transmitting member.

3. The solid-state image capturing device according to claim 2, wherein a part of the sealing resin member is extended into a gap between the wall member and the substrate.

4. The solid-state image capturing device according to claim 3, wherein an interval of the gap is less than a thickness of the image capturing element.

5. The solid-state image capturing device according to claim 1, wherein
the hole part is at a position in the substrate where a terminal is formed, and the hole part is blocked by a solder.

6. The solid-state image capturing device according to claim 1, further comprising:
a bonding resin between the substrate and the image capturing element, wherein the bonding resin is C-shaped in a plan view.

7. The solid-state image capturing device according to claim 1, wherein the wall member includes a photosensitive material.

8. The solid-state image capturing device according to claim 1, wherein the wall member includes a bonding resin.

9. A manufacturing method of a solid-state image capturing device, comprising:
mounting an image capturing element on a substrate, wherein
the substrate includes a hole part, and
the hole part penetrates through a front surface and a back surface of the substrate;
forming a support member in a first part of an outer-peripheral portion of the image capturing element, wherein the outer-peripheral portion surrounds a light receiving unit of the image capturing element;
causing the support member to support a light transmitting member provided with a wall member, wherein
the wall member is in a second part of an outer-peripheral portion of a principal surface of the light transmitting member,
the principal surface is opposite to the image capturing element, and
the second part is different from the first part of the outer-peripheral portion of the image capturing element; and
sealing a peripheral portion of the image capturing element by a sealing resin member, wherein the sealing resin member comprises a thermosetting resin.

* * * * *